United States Patent [19]
Hirschenberger et al.

[11] Patent Number: 5,697,091
[45] Date of Patent: Dec. 9, 1997

[54] DISTORTION-FREE CHOPPER-BASED SIGNAL MIXER

[75] Inventors: Frank Michael Hirschenberger, Royal Oak; Richard Bruce Harris; John Elliott Whitecar, both of Plymouth, all of Mich.

[73] Assignee: Ford Motor Company, Dearborn, Mich.

[21] Appl. No.: 597,755

[22] Filed: Feb. 7, 1996

[51] Int. Cl.$^6$ ..................................................... H04B 1/26
[52] U.S. Cl. ........................ 455/318; 455/333; 327/113; 327/124; 327/327
[58] Field of Search .................................. 455/333, 323, 455/325, 318; 327/113, 355, 124; 332/116, 178

[56] References Cited

U.S. PATENT DOCUMENTS 4,525,871  7/1985  Foyt et al. .

OTHER PUBLICATIONS

NE612 Double–Balanced Mixer and Oscillator, Product Specification, Nov. 3, 1987, pp. 163–168.

*Primary Examiner*—Andrew Faile
*Assistant Examiner*—Christopher D. Onuaku
*Attorney, Agent, or Firm*—Mark Mollon

[57]     ABSTRACT

An AM-modulated carrier signal is converted to a lower carrier frequency through mixing with a square wave local oscillator signal. A field-effect transistor chops the modulated signal according to the square wave signal so that a chopped or sampled version of the modulated signal is created without passing the signal through a semiconductor junction. A filter then selects the desired mixing product. Thus, a distortion free mixing of the signal is obtained using low cost components including a JFET switch and a square wave output from a microcontroller.

11 Claims, 2 Drawing Sheets

DISTORTION-FREE CHOPPER-BASED SIGNAL MIXER

BACKGROUND OF THE INVENTION

The present invention relates in general to a mixer for shifting an information signal in frequency, and more specifically to a low-cost chopper mixer without any distortion caused by passing the signal through a semiconductor junction.

Signal mixers are utilized in superheterodyne receivers to shift the frequency of an information signal. An original signal, such as a broadcast radio frequency (RF) signal received by an antenna, is shifted to a predetermined frequency where the information signal is filtered to remove adjacent signals and image products. A typical intermediate frequency (IF) used in an AM tuner is 450 kHz.

Audio systems, including radio receivers, are increasingly employing digital processing of audio signals to provide enhanced audio performance and low cost. In order to digitally process an analog signal such as an AM IF signal, the signal must be digitized in an analog-to-digital converter. However, the cost of an analog-to-digital converter becomes higher when high frequency analog signals are to be converted. Therefore, an AM IF signal must be first reduced in frequency to a sufficiently low value to permit easy digital conversion of the signal. However, it is not desirable to merely reduce the frequency at which the IF signal is originally produced because a higher intermediate frequency is necessary to provide proper image rejection. Furthermore, it serves the objective of producing a low cost receiver to use the low cost integrated circuits which are available employing the standard IF frequency of 450 kHz.

SUMMARY OF THE INVENTION

The present invention has the advantage of providing a low cost circuit to mix a relatively high intermediate frequency to a down-converted intermediate frequency without introducing distortion into the information signal. In the case of a digital radio receiver, lower cost analog-to-digital converters can be employed to digitize the down-converted intermediate frequency, while using a minimum number of additional parts.

In one aspect, the invention provides a mixer for heterodyning an information signal and a square wave signal. A chopper junction receives the information signal. A field-effect transistor having first and second input/output terminals and a control terminal has its first input/output terminal connected to the chopper junction. A second input/output terminal is connected to ground, and the control terminal is connected to receive the square wave signal so that the field-effect transistor chops the information signal in accordance with the square wave. An output filter has an input coupled to the chopper junction and has a frequency characteristic for selecting a desired mixing product of the mixer. The mixer shifts the information signal and frequency without passing the information signal through a semiconductor junction.

DETAILED DESCRIPTION OF PREFERRED EMBODIMENTS

Figure 1:
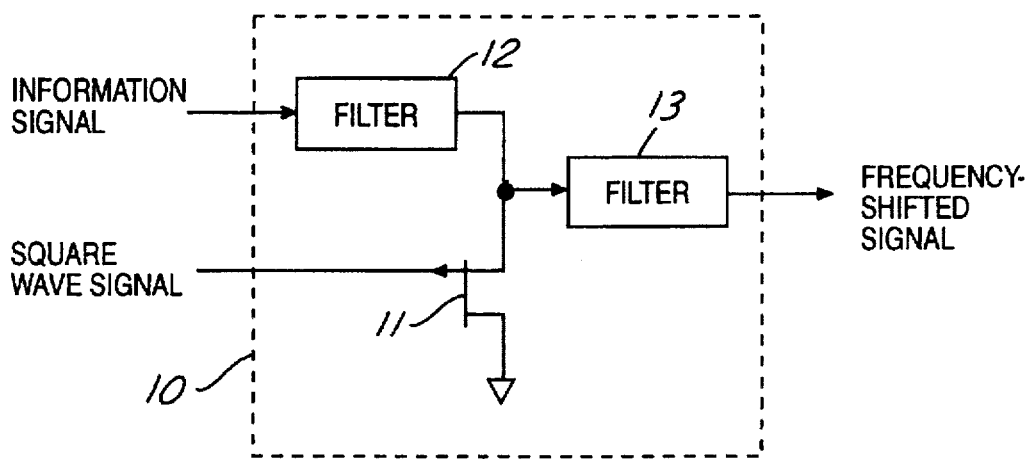
FIG. 1 is a block diagram showing a chopper-based mixer according to the present invention.

FIG. 1 shows a signal mixer 10 receiving an information signal as an input and producing a frequency-shifted signal as an output. The mixing function is performed without creating distortion because the information signal is never passed through any semiconductor junction which would otherwise be a source of distortion. Instead, a P-channel junction field effect transistor (JFET) "chops" or "samples" the information signal according to a square wave signal which performs the function of a local oscillator signal. The JFET has first and second input/output terminals approximating a switch to produce either a near open circuit or a near short circuit between the terminals.

Mixer 10 includes a JFET 11. The information signal is passed through a passive attenuator/filter 12 and is coupled to the source terminal of JFET 11. The gate terminal of JFET 11 is coupled to the square wave local oscillator signal. The drain terminal of JFET 11 is connected to ground. JFET 11 is a P-channel JFET in the illustrated embodiment, although other types of FETs can be used. The source terminal of JFET 11 is further connected to the input of a lowpass filter 13.

In operation, JFET 11 is switched on and off by the square wave signal which chops the information signal at the rate of the square wave signal. Thus, the mixer effectively multiplies the information signal with a square wave having a value of "1" when the JFET is off and "0" when the JFET is on, thereby producing signals at the sum and difference frequencies as in any mixing operation. In the present invention, mixing is performed without passing the signal through any semiconductor junction. The output signal is then passed through filter 13 so that only the desired mixing product (e.g., the difference signal) is passed to the output of the mixer.

In a digital system, a square wave oscillator signal is easily producible at almost any desired frequency, for example, a microprocessor clock circuit may provide the basis for an appropriate oscillator signal. Mixing circuit 10 can thus be implemented at low cost since only a few simple components are required.

Figure 2:
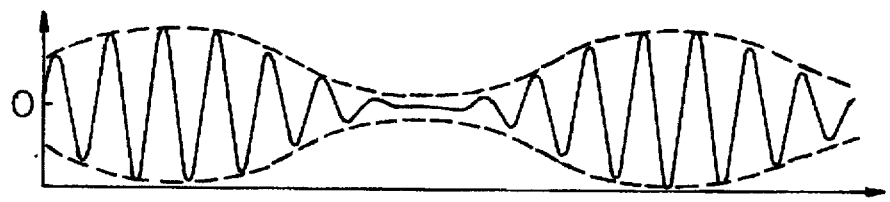
FIG. 2 shows an information signal prior to mixing.

FIG. 2 shows an amplitude modulated information signal prior to input to the mixer. For example, an AM IF signal may have a frequency of 450 kHz and a variable amplitude which encodes the information (e.g., audio signal) as shown by the signal envelope.

Figure 3:
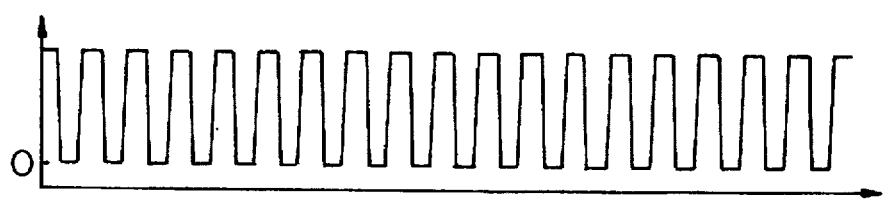
FIG. 3 shows a square wave mixing signal.

FIG. 3 shows a square wave signal for mixing with the information signal of FIG. 2. The square wave signal has a 50% duty cycle and has a frequency different from the frequency of the information signal by an amount equal to the desired final frequency of the frequency-shifted signal. For example, a local oscillator square wave signal of 459.5 kHz can be used to produce a frequency-shifted signal at 9.5 kHz.

Figure 4:
FIG. 4 shows a chopped information signal.

FIG. 4 illustrates the chopped information signal appearing at the source terminal of JFET 11 in FIG. 1. When JFET 11 is off, the chopped signal in FIG. 4 equals the original information signal. When JFET 11 is on, the signal in FIG. 4 equals approximately 0 volts due to a low impedance connection to ground through JFET 11 and due to the front end impedance provided by filter 12.

Figure 5:
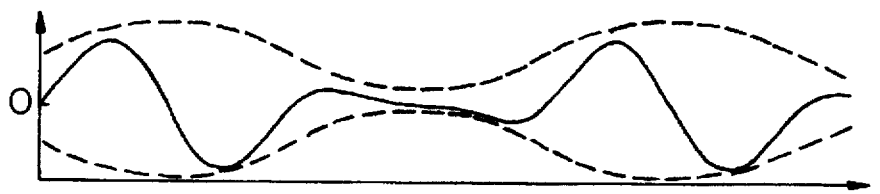
FIG. 5 shows a frequency-shifted information signal after the chopped signal is lowpass filtered.

FIG. 5 shows the frequency-shifted signal after output filtering in filter 13 so that the frequency-shifted signal encodes the same information envelope but using a much lower carrier frequency. Thus, the analog frequency-shifted signal can be more easily digitized for digital signal processing.

Figure 6:
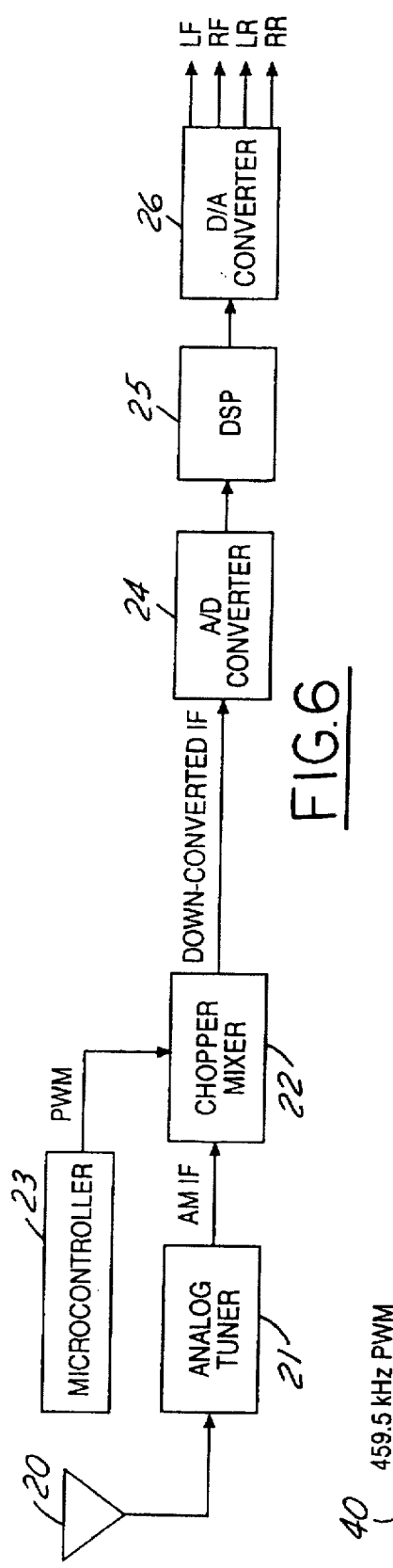
FIG. 6 shows a block diagram of a radio receiver incorporating the present invention.

A radio receiver incorporating the present invention is shown in FIG. 6. An antenna 20 picks up broadcast signals and provides an RF signal to an analog tuner 21. For example, the RF signal may be an AM broadcast signal and analog tuner 21 may include a double-mixing AM tuner providing an AM IF output at 450k kHz. The AM IF signal is provided to a chopper mixer 22 for down-conversion. A microcontroller 23 which controls operation of the receiver coordinates operation of analog and digital radio functions. Microcontroller 23 further includes a pulse width modulated (PWM) output for providing a square wave signal at any selectable frequency. In the preferred embodiment, the PWM square wave signal has a 50% duty cycle and a frequency of 459.5 kHz.

A down-converted IF signal having a frequency of 9.5 kHz is provided from chopper mixer 22 to the input of an analog-to-digital (A/D) converter 24. A digitized or sampled version of the down-converted IF is provided to a digital signal processor (DSP) 25 that performs demodulation of the down-converted and digitized AM IF signal. DSP 25 may also provide stereo detection, such as CQUAM demodulation. The recovered information signal is provided from DSP 25 to the input of a digital-to-analog (D/A) converter 26 for producing left and right and front and rear audio signals.

Figure 7:
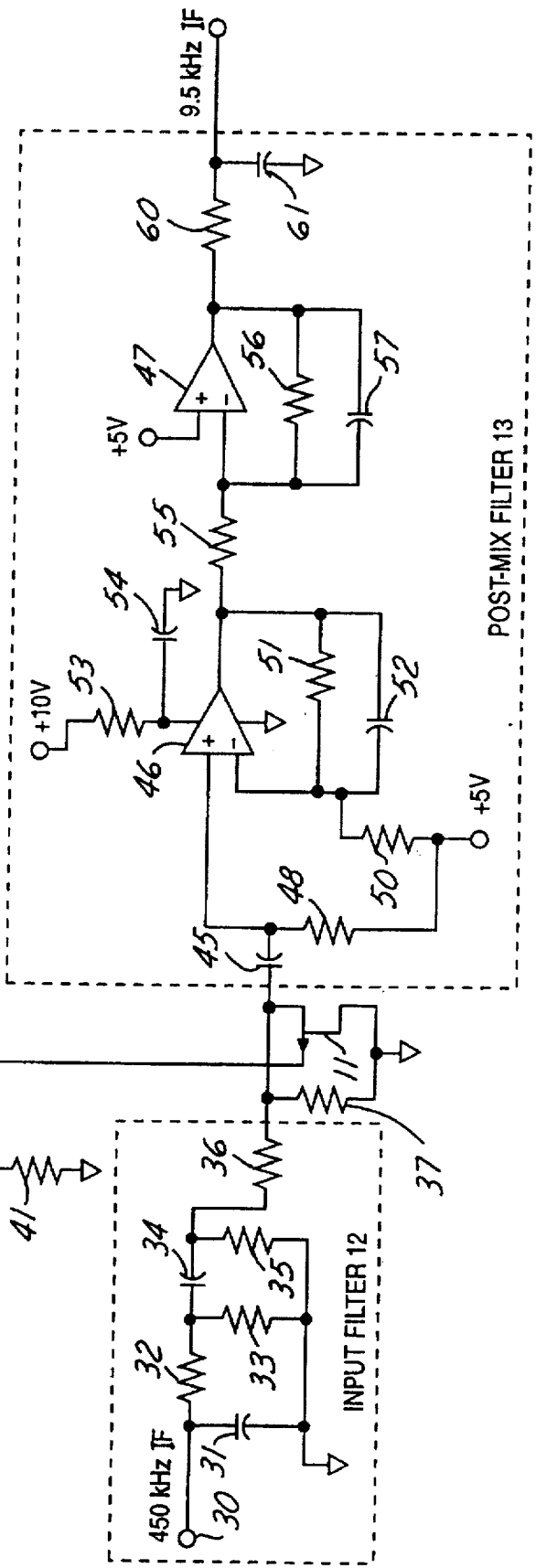
FIG. 7 is a schematic diagram showing the chopper-based signal mixer of the present invention in greater detail.

Chopper mixer 22 is shown in more detail in FIG. 7. Input filter 12 receives a 450 kHz IF signal at its input terminal 30. A highpass filter comprising capacitors 31 and 34 and resistors 32, 33, and 35 reject undesirable audio frequency components coming from the analog tuner. A series resistor 36 provides an impedance of about 30K ohms to provide attenuation and isolation between JFET 11 and the analog tuner (and more specifically to provide isolation between the local oscillator square wave signal and the tuner). Thus, the output of resistor 36 is connected to the source terminal of JFET 11. The output of resistor 36 is also coupled to ground through a bias resistor 37.

The gate terminal of JFET 11 receives the square wave PWM mixing signal via a terminal 40. A bias resistor 41 is coupled between the gate terminal and ground.

The chopped output signal appearing at the source terminal of JFET 11 is provided to the input of post-mixer filter 13 through a coupling capacitor 45. Filter 13 is preferably comprised of a two-stage active lowpass filter including a pair of op amps 46 and 47. The non-inverting input of op amp 46 receives the chopped information signal plus a bias voltage received through a resistor 48 coupled to a fixed voltage of +5 volts. The inverting input of op amp 46 likewise receives a fixed +5 volt bias through a resistor 50. A feedback resistor 51 and a feedback capacitor 52 are connected in parallel from the output of op amp 46 to the inverting input of op amp 46. Power is supplied to op amp 46 at the junction of a resistor 53 and capacitor 54 which are connected between a +10 volt supply and ground.

The output of op amp 46 is coupled to the inverting input of op amp 47 through a coupling resistor 55. The non-inverting input of op amp 47 is connected to a +5 volt supply. Feedback resistor 56 and feedback capacitor 57 are connected in parallel between the output of op amp 47 and the inverting input of op amp 47. The output of op amp 47 is RC filtered by a resistor 60 and a capacitor 61.

Active filter 13 filters off bleed-through of local oscillator signals included in the JFET output signal and filters off unwanted mixing products. An active filter is utilized in order to provide signal gain in order to match the dynamic range of the output signal with the dynamic range of the A/D converter. Thus, an AM IF signal of 450 kHz has been down-converted to an AM IF signal of 9.5 kHz.

What is claimed is:

1. A mixer for heterodyning an information signal and a square wave signal, comprising:

a chopper junction receiving said information signal;

a field-effect transistor having first and second input/output terminals and a control terminal, said first input/output terminal being connected to said chopper junction, said second input/output terminal being coupled to ground, and said control terminal being connected to receive said square wave signal so that said field-effect transistor chops said information signal in accordance with said square wave;

an output filter having an input coupled to said chopper junction, said output filter having a frequency characteristic for selecting a desired mixing product of said mixer; and whereby said mixer shifts said information signal in frequency without passing said information signal through a semiconductor junction.

2. The mixer of claim 1 wherein said square wave signal switches said field-effect transistor between fully-on and fully-off states with a 50% duty cycle.

3. The mixer of claim 2 wherein said square wave signal is generated under microprocessor control.

4. The mixer of claim 1 wherein said information signal is shifted down in frequency and wherein said output filter is comprised of a second-order low pass filter.

5. A broadcast radio receiver comprising:

an intermediate frequency (IF) section generating an IF signal from a radio frequency (RF) broadcast signal;

a chopper junction receiving said IF signal;

oscillator means for generating a square wave signal having a fixed frequency not equal to a frequency of said IF signal;

a field-effect transistor having first and second input/output terminals and a control terminal, said first input/output terminal being connected to said chopper junction, said second input/output terminal being coupled to ground, and said control terminal being connected to said oscillator means to receive said square wave signal so that said field-effect transistor chops said IF signal in accordance with said square wave;

an output filter having an input coupled to said chopper junction, said output filter having a frequency characteristic for selecting a down-converted IF signal;

an analog-to-digital converter digitizing said down-converted IF signal; and a digital signal processor demodulating said down-converted IF signal.

6. The receiver of claim 5 further comprising a conditioning circuit providing isolation between said IF section and said chopper junction.

7. The receiver of claim 5 wherein said output filter is comprised of a second-order low pass filter.

8. The receiver of claim 5 wherein said oscillator means is comprised of a microprocessor generating said square wave signal from a pulse width modulated output circuit.

9. The receiver of claim 5 wherein said field-effect transistor is comprised of a P-channel JFET.

10. A method of shifting the frequency of an information signal, comprising the steps of:

generating said information signal having a first frequency;

applying said information signal to a chopping junction;

generating a square wave signal having a second frequency, said square wave signal oscillating between first and second voltages substantially at a 50% duty cycle;

chopping said information signal in response to said square wave signal by shunting said information signal to ground when said square wave signal is at said first voltage and isolating said information signal from said ground when said square wave signal is at said second voltage; and filtering said chopped information signal to select said information signal at a shifted frequency.

11. The method of claim 10 wherein said shifted frequency is equal to a difference between said first and second frequencies.

* * * * *